(12) United States Patent
Itani et al.

(10) Patent No.: US 11,291,083 B2
(45) Date of Patent: Mar. 29, 2022

(54) HEAT TREATMENT APPARATUS

(71) Applicant: TOYOKO KAGAKU CO., LTD., Kanagawa (JP)

(72) Inventors: Shiniti Itani, Kanagawa (JP); Tomohiro Tsuruda, Kanagawa (JP)

(73) Assignee: TOYOKO KAGAKU CO., LTD., Kawasaki (JP)

( * ) Notice: Subject to any disclaimer, the term of this patent is extended or adjusted under 35 U.S.C. 154(b) by 418 days.

(21) Appl. No.: 16/263,455

(22) Filed: Jan. 31, 2019

(65) Prior Publication Data

US 2019/0166652 A1    May 30, 2019

Related U.S. Application Data

(63) Continuation of application No. 14/236,161, filed as application No. PCT/JP2011/068100 on Aug. 9, 2011, now Pat. No. 10,237,915.

(51) Int. Cl.
*H05B 1/02* (2006.01)
*H01L 21/324* (2006.01)
(Continued)

(52) U.S. Cl.
CPC ....... *H05B 1/0233* (2013.01); *H01L 21/0445* (2013.01); *H01L 21/324* (2013.01); *H01L 21/67109* (2013.01); *H01L 21/67248* (2013.01)

(58) Field of Classification Search
CPC ............ H01L 21/67109; H01L 21/324; H01L 21/0445; H01L 21/67248; H05B 1/0233
See application file for complete search history.

(56) References Cited

U.S. PATENT DOCUMENTS 2,897,335 A * 7/1959 Finch ................ B23K 3/033
                                              219/237
5,536,918 A    7/1996 Ohkase et al.
(Continued)

FOREIGN PATENT DOCUMENTS

JP    64-035909 A    2/1989
JP    04-245510 A    9/1992
(Continued)

OTHER PUBLICATIONS

Oct. 28, 2014 Office Action issued in Japanese Application No. 2013-527775.
(Continued)

*Primary Examiner* — Dana Ross
*Assistant Examiner* — Kuangyue Chen
(74) *Attorney, Agent, or Firm* — Oliff PLC

(57) ABSTRACT

A heat treatment apparatus is provided which includes heating means for enabling a rapid temperature rise to a temperature of 1600 through 1900° C., and a thermometer capable of accurately measuring temperatures even when rapid temperature rises and drops are repeated, the heat treatment apparatus being capable of performing heat treatment of an SiC substrate with good mass productivity after ion implantation. The heat treatment apparatus enables the heat treatment of a semiconductor substrate at 1600 to 1900° C. by temperature control using a resistance heating element and thermocouple thermometers. The heat treatment apparatus is configured such that the resistance heating element and the thermocouple thermometers include a common constituent metal as a main component.

11 Claims, 3 Drawing Sheets

(51) Int. Cl.
*H01L 21/67* (2006.01)
*H01L 21/04* (2006.01)

(56) References Cited

U.S. PATENT DOCUMENTS

| | | | |
|---|---|---|---|
| 5,947,718 A | 9/1999 | Weaver | |
| 6,246,031 B1 | 6/2001 | Yoo | |
| 6,566,632 B1 | 5/2003 | Katata et al. | |
| 2003/0089698 A1* | 5/2003 | Ratliff | C23C 16/463 |
| | | | 219/390 |
| 2004/0146827 A1 | 7/2004 | Beatty et al. | |
| 2006/0057287 A1* | 3/2006 | Foss | C04B 35/58028 |
| | | | 427/248.1 |
| 2006/0094261 A1 | 5/2006 | Frisella et al. | |
| 2007/0034799 A1 | 2/2007 | Watanabe | |
| 2007/0137794 A1 | 6/2007 | Qiu et al. | |
| 2010/0124613 A1 | 5/2010 | Den Berg | |
| 2012/0086107 A1 | 4/2012 | Yamamoto et al. | |

FOREIGN PATENT DOCUMENTS

| | | |
|---|---|---|
| JP | 2000-286331 A | 10/2000 |
| JP | 2001-007035 A | 1/2001 |
| JP | 2003-077855 A | 3/2003 |
| JP | 2005-019725 A | 1/2005 |
| JP | 2009-007193 A | 1/2009 |
| JP | 2009-124005 A | 6/2009 |

OTHER PUBLICATIONS

Stagg et al., "A Method to Account for Window Birefringence Effects on Ellipsometry Analysis," Journal of Physics D: Applied Physics, Nov. 14, 1993, vol. 26, No. 11, pp. 2028-2035.
Balloffet et al., "Pressure Sintering of Silicon Carbide," Atomic Energy of Canada Limited, Mar. 1971, pp. 1-39.
Feb. 9, 2015 Extended Search Report issued in European Application No. 11870675.3.
Jun. 17, 2016 Office Action Issued in U.S. Appl. No. 14/236,161.
Sep. 13, 2016 Office Action issued in European Patent Application No. 11870675.3.
Jul. 27, 2017 Office Action issued in U.S. Appl. No. 14/236,161.
Nov. 14, 2017 Office Action issued in U.S. Appl. No. 14/236,161.
Mar. 27, 2018 Office Action Issued in U.S. Appl. No. 14/236,161.
Jul. 24, 2018 Office Action Issued in U.S. Appl. No. 14/236,161.
Nov. 8, 2011 Search Report issued in International Application No. PCT/JP2011/068100.
Oct. 30, 2015 Office Action issued in U.S. Appl. No. 14/236,161.

* cited by examiner

VIEW ALONG X-X

HEAT TREATMENT APPARATUS

This is a Continuation of U.S. application Ser. No. 14/236,161 filed Jan. 30, 2014, which is a National Stage of International Application No. PCT/JP2011/068100 filed Aug. 9, 2011. The disclosures of the prior applications are hereby incorporated by reference herein in their entireties.

TECHNICAL FIELD

The present invention relates to a heat treatment apparatus which is useful for the heat treatment of an SiC substrate after ion implantation.

BACKGROUND ART

The activation heat treatment of an SiC substrate after ion implantation requires a temperature from 1600 to 1900° C. It is also required to perform the activation heat heat treatment in a short period of time in order to activate impurities without imparting time for atoms to move. It is further required to reduce variations in the in-plane temperature distribution of the SiC substrate being heat treated as well as to provide improved mass productivity.

In response to such a demand, a heat treatment apparatus has been suggested in which a substrate was retained in a tube-shaped body formed of a high melting point material, and the tube-shaped body was heated with an RF coil at a high frequency to thereby create a high-temperature region in the tube-shaped body (Patent Literature 1). The heat treatment apparatus provides a temperature rise rate of about 20 to 30° C. per minute which is two to three times that provided by heating using a conventional infrared lamp, thereby reducing variations in the in-plane temperature distribution.

CITATION LIST

Patent Literature

Patent Literature 1: Japanese Patent Application Laid-Open No. 2003-77855

SUMMARY OF INVENTION

Technical Problem

However, the aforementioned heat treatment apparatus that employs high-frequency heating is reduced in mass productivity of substrates to be treated because the structure of a jig for retaining the substrate in a high-temperature region restricts the number of substrates to be heat treated at a time to 4 to 8.

Furthermore, the heat treatment apparatus has conventionally often provided temperature control by measuring the temperature of the substrate with a radiation thermometer. However, the radiation thermometer requires a complicated procedure of determining a calibration curve by another temperature measurement method because the emissivity of thermal radiation differs depending on the substance to be measured. Furthermore, the radiation thermometer is significantly influenced by the surface state of an object being measured, and accurately measures temperatures with difficulty even due to soil on the measurement port.

In response to this, it is conceivable to use a thermocouple thermometer in place of the radiation thermometer. However, use of the thermocouple thermometer in the high-frequency heating apparatus may lead to inaccurate temperature measurement due to self-heating or noise caused by induction. In this context, the heating method may be changed from the high-frequency heating to resistance heating. In this case, the problem of the self-heating can be resolved. However, the activation heat treatment after ion implantation leads to high temperature rise and drop rates, so that for example, use of the thermocouple thermometer incorporating an iridium rhodium alloy with a ceramic heater serving as heating means would cause the thermocouple to be worn and have a break due to grain boundaries.

In view of the aforementioned problems associated with the conventional techniques, an object of the present invention is to provide a heat treatment apparatus which includes: heating means enabling a rapid temperature rise to a temperature of 1600 through 1900° C.; and a thermometer which can measure temperatures with accuracy even when a temperature rise and a temperature drop are rapidly repeated, and which is capable of heat treating a large number of substrates at a time and performing heat treatment on an SiC substrate with improved mass productivity after ion implantation.

Solution to Problem

The present inventor has found that when employing resistance heating as the heating method for a heat treatment apparatus and a thermocouple thermometer for temperature control, a heat treatment apparatus is configured to utilize a heating element responsible for the resistance heating and the thermocouple each being formed of a common main component metal, so as to provide a common atmosphere suitable for both. This can configure the heat treatment apparatus which is capable of maintaining accurate heat control due to optimum heat treatment conditions being readily set even when abrupt increases and drops in temperature are repeated.

That is, the present invention provides a heat treatment apparatus for a semiconductor substrate, in which heat treatment can be performed at 1600 to 1900° C. by temperature control using a resistance heating element and a thermocouple thermometer, wherein the resistance heating element and the thermocouple thermometer include a common constituent metal as a main component.

Advantageous Effects of Invention

The heat treatment apparatus according to the present invention employs a resistance heating element for performing resistance heating and a thermocouple thermometer formed of a main component common to that of the resistance heating element so as to provide temperature control to the heat treatment of a substrate. This makes it possible to provide a rapid temperature rise to a temperature of 1600 through 1900° C. as well as to provide accurate temperature control to heat treatment even in the presence of repeated rapid rises and drops in temperature. Thus, the heat treatment of an SiC substrate after ion implantation can be carried out in an improved manner.

In addition, since a few tens of substrates can be heat treated at a time, the heat treatment of substrates can be performed with good mass productivity.

DESCRIPTION OF EMBODIMENTS

Figure 1:
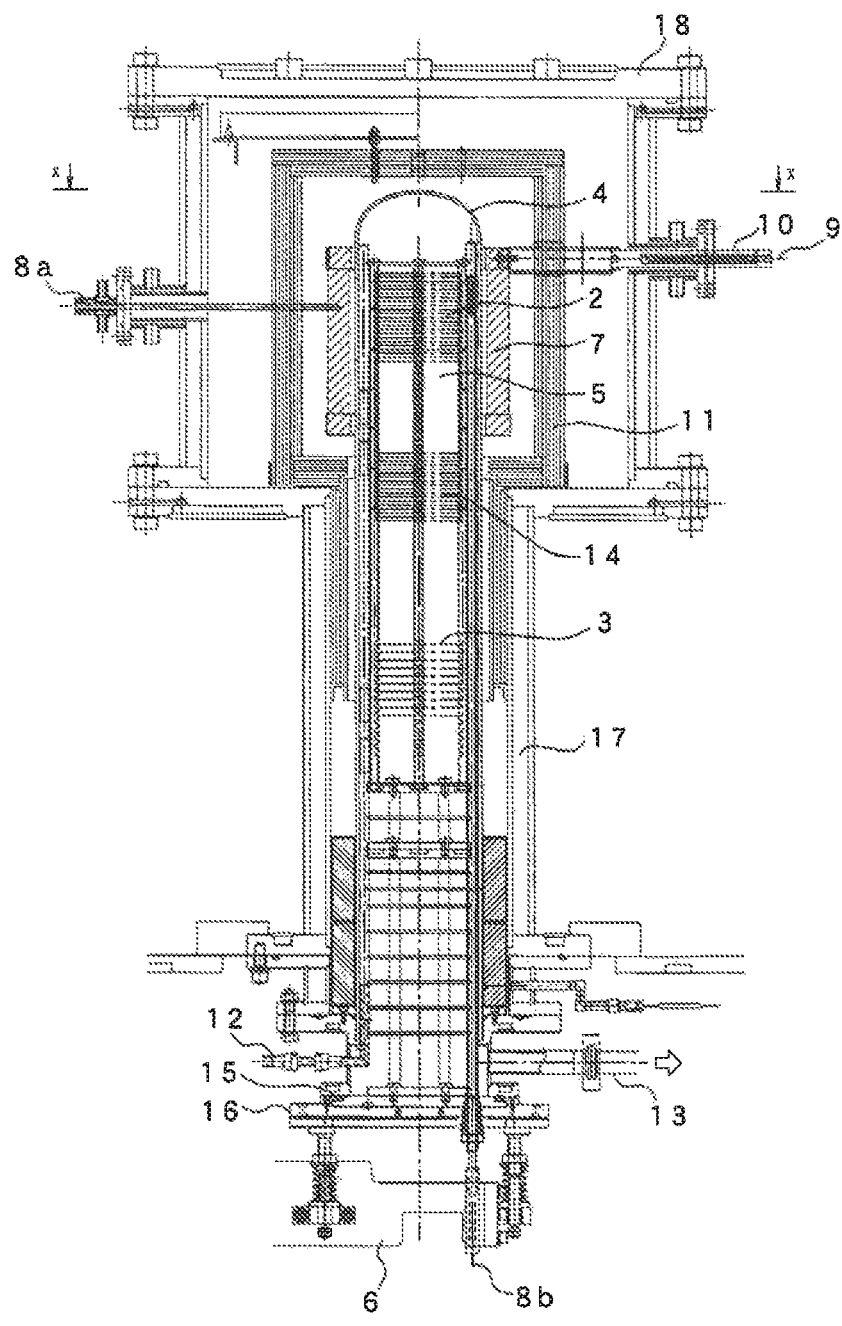
FIG. 1 is a longitudinal sectional view illustrating a heat treatment apparatus according to an embodiment.

Now, referring to the drawings, the present invention will be described more specifically.

Figure 2:
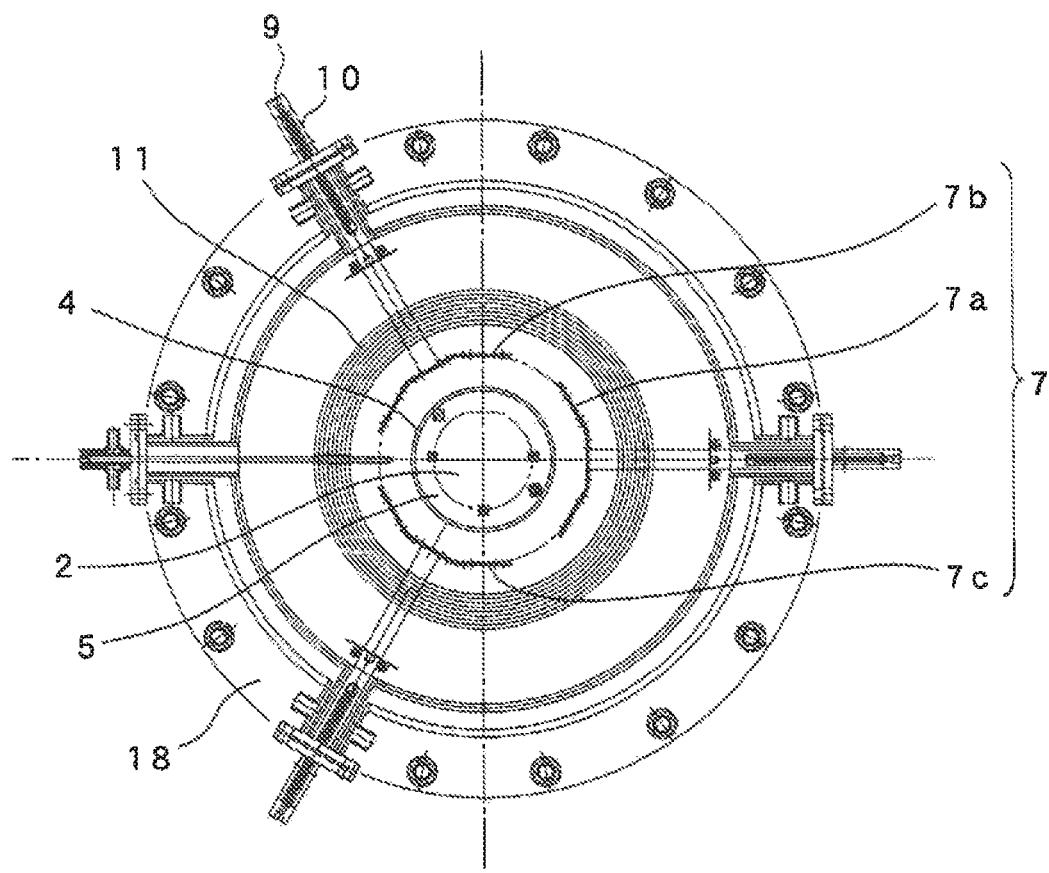
FIG. 2 is across-sectional view, taken along X-X, illustrating the heat treatment apparatus according to the embodiment.

FIG. 1 is a longitudinal sectional view illustrating a heat treatment apparatus 1 according to an embodiment of the present invention, and FIG. 2 is across-sectional view taken along X-X.

This heat treatment apparatus 1 activates an SiC substrate 2 after ion implantation and includes: a vertical type boat 3 which can accommodate 20 or more SiC substrates 2 at the same time; a tube type container (hereafter to be referred to as the SiC tube) 4 formed of a high melting point material (for example, SiC); a transfer device 6 for inserting or drawing out the boat 3 into a heating chamber 5 formed in an upper region within the SiC tube 4; a resistance heating element 7 disposed in a tubular shape so as to surround the heating chamber 5; a first thermocouple thermometer 8a with an end disposed between the resistance heating element 7 and the SiC tube 4; and a second thermocouple thermometer 8b with an end disposed in the heating chamber 5. The outer side of the resistance heating element 7 disposed in a tubular shape is surrounded by a reflector 11 formed from a tungsten and molybdenum alloy.

More specifically, the resistance heating element 7 is made up of three plate type heating elements that are each bent to form three planes, so that these three bent plate type heating elements 7a, 7b, and 7c are formed in a tubular shape to surround the outer periphery of the SiC tube 4 that forms the heating chamber 5. In this case, as shown in FIG. 2, the tube-shaped body is an approximately regular dodecagon in cross section, and the three bent plate type heating elements 7a, 7b, and 7c occupy nine sides of the generally regular dodecagon. Also provided are three heater electrodes 9 and guide pipes 10 corresponding to the respective three bent plate type heating elements 7a, 7b, and 7c. As illustrated by FIGS. 1 and 2, each bent plate type heating element 7a, 7b, and 7c includes a top surface 71, a bottom surface 72 and a single continuous side surface 73, the single continuous side surface 73 having a plurality of bent planes 73p, 73q, and 73r with each plane 73p, 73q, and 73r of the side surface 73 intersecting each other and each plane 73p, 73q, and 73r extends between the top surface 71 and the bottom surface 72.

To dispose a plurality of plate type heating elements in a tubular shape, the heating elements preferably form a circle in cross section from the viewpoint of the thermal uniformity in the cross section of the heating chamber 5. However, plate type heating elements may be disposed so as to form a regular polygon with six sides or more, for example, around the SiC tube 4 having an outer diameter of 145 mm or more, more preferably 145 to 185 mm, thereby ensuring a sufficient thermal uniformity in the cross section.

On the other hand, in disposing a plurality of plate type heating elements in a tubular shape, the entire periphery is not always required to be occupied with the heating elements, so that the individual plate type heating elements may be disposed with a gap therebetween. However, when there are too many regions in which no heating element exists, the temperature of the heating chamber 5 cannot be rapidly increased to 1600 through 1900° C. Thus, for example, in employing a plurality of plate type heating elements to form a regular polygon with 12 or more sides, it is preferable to occupy ¾ the number of sides or greater with the heating elements. Thus, the resistance heating element 7 of this embodiment which employs the three bent plate type heating elements 7a, 7b, and 7c, each having three continuous rectangular planes, so as to form a generally regular dodecagon provides the heating chamber 5 with an improved thermal uniformity. In other words, as illustrated by FIGS. 1 and 2, the side surfaces 73 collectively form an approximately tubular polygonal shape in cross section in which each plane 73p, 73q, and 73r faces a center of the approximately tubular polygonal shape where the heating chamber 5 is located and a periphery of the approximately tubular polygonal shape includes the plurality of metal heating elements 7a, 7b, and 7c disposed with a gap between adjacent metal heating elements 7a, 7b, and 7c.

On the other hand, in disposing plate type heating elements so that the heating elements form a tubular polygonal shape in cross section, bent plate type heating elements each having a plurality of adjacent planes, more preferably two to four continuous side surfaces, may be more preferably used because the total number of heating elements can be reduced and the manufacturing costs of heating elements can also be reduced. That is, the side surfaces collectively form an approximately tubular polygonal shape in cross section in which a periphery of the approximately tubular polygonal shape includes the plurality of metal heating elements disposed with a gap between adjacent metal heating elements. In this context, although a resistance heating element which is made of tungsten and formed cylindrically in a mesh is conventionally known, bent plate type heating elements can be disposed in a tubular shape as a heating element as in this embodiment, thereby reducing the processing costs of the heating element by 15 to 20%.

Note that rod-shaped heating elements may also be conceivably disposed in a tubular shape in place of the plate type heating elements, but may lead to an increase in the number of electrodes, thus unpreferably making the processing of the mantle and the structure of the heating chamber 5 complicated.

On the other hand, as the first thermocouple thermometer 8a and the second thermocouple thermometer 8b, the heat treatment apparatus 1 includes a tungsten rhenium alloy thermocouple (rhenium 5%, 26%) which has a main component common to that of the aforementioned plate type heating elements 7a, 7b, and 7c. Thus, the heat treatment apparatus 1 can be used at a high temperature in a reduction atmosphere. Furthermore, the heat treatment apparatus 1 can maintain a heating accuracy within ±1° C. with respect to 1900° C. even when heat treatments are repeated because heating control is performed not by high-frequency heating but by resistance heating and a thermocouple thermometer. Heating the heating chamber by a conventional combination of the high-frequency heating and the radiation thermometer may cause an error of about ±10° C. It can be thus seen that the heat treatment apparatus 1 of this embodiment provides a significantly improved temperature control accuracy.

As atmosphere control means, the heat treatment apparatus 1 has a gas inlet pipe 12 for drawing an inert gas such as argon or nitrogen into the SiC tube 4 that forms the heating chamber 5, and a gas discharge pipe 13 for discharging the gas from the SiC tube 4. The lower end of the SiC tube 4 is closed with a quartz plate 16 via an O-ring 15. Note that dummy plates 14 are placed at a lower portion of the heating chamber 5 inside the SiC tube 4 to thermally insulate the heating chamber 5, and a farther lower region is surrounded by a sub-chamber 17 through which water is passed to cool down the SiC tube 4. Furthermore, a stainless steel water cooling pipe 18 is provided outside the reflector 11.

The heat treatment apparatus 1 is used as follows.

Figure 3:
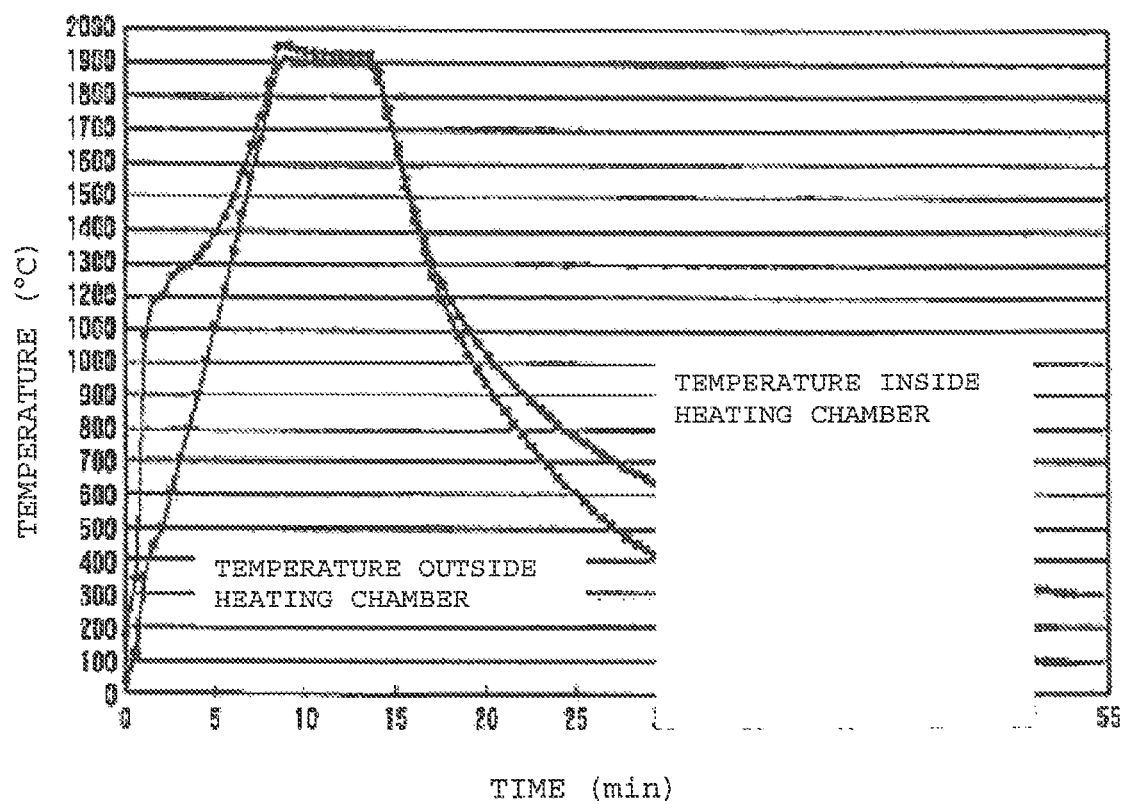
FIG. 3 is a view illustrating a change in heat treatment temperature.

At a temperature of 300° C. or lower in the heating chamber 5, a substrate 2 placed on the boat 3 is inserted into the heating chamber 5 by actuating the transfer device 6, an inert gas such as argon is drawn from the upper end of the SiC tube 4 through the gas inlet pipe 12, and oxygen and water are discharged from the lower end of the SiC tube 4 through the gas discharge pipe 13. Then, the resistance heating element 7 is used to rapidly heat the heating chamber 5 to a temperature of 1600° C. or higher, heat treatment is completed in a few minutes, and the heating chamber 5 is then cooled down. FIG. 3 shows an example of changes in temperature inside and outside the heating chamber 5 for this case. As can be seen, the heating apparatus enables a rapid temperature rise at a rate of 100° C. or greater per minute, and preferably at a rate of 200° C. or greater per minute. It is thus possible to perform thermal activation treatment after ion implantation without diffusing impurities in the substrate.

REFERENCE SIGNS LIST

1 Heat treatment apparatus
2 Substrate
3 Boat
4 SiC tube
5 Heating chamber
6 Transfer device
7 Resistance heating element
7a, 7b, 7c Plate type heating element
8a, 8b Thermocouple thermometer
9 Heater electrode
10 Heater electrode guide pipe
11 Reflector
12 Gas inlet pipe
13 Gas discharge pipe
14 Dummy plate
15 O-ring
16 Quartz plate
17 Sub-chamber
18 Water cooling pipe

The invention claimed is:

1. A heat treatment apparatus for a semiconductor substrate, in which heat treatment can be performed at 1600 to 1900° C. by temperature control using a resistance heating element and a thermocouple thermometer, wherein:

the resistance heating element and the thermocouple thermometer include a common constituent metal as a main component, the resistance heating element includes a plurality of bent plate type metal heating elements, each metal heating element has a single continuous side surface having two to four bent planes, and the side surfaces collectively form an approximately tubular polygonal shape in a first cross section in which a periphery of the approximately tubular polygonal shape includes the plurality of metal heating elements disposed with a gap between adjacent metal heating elements, and in the first cross section each metal heating element includes the two to four bent planes with each plane having a rectangular shape in a second cross section perpendicular to the first cross section.

2. The heat treatment apparatus according to claim 1, wherein the heat treatment apparatus enables a temperature rise of 100° C. or greater per minute.

3. The heat treatment apparatus according to claim 1, comprising a heating chamber formed of a high melting point material, the heating chamber disposed inside the metal heating elements.

4. The heat treatment apparatus according to claim 3, wherein the metal heating elements have three bent planes.

5. The heat treatment apparatus according to claim 3, wherein the heating chamber is formed of a SiC tube.

6. The heat treatment apparatus according to claim 2, comprising a heating chamber formed of a high melting point material, the heating chamber disposed inside the metal heating elements.

7. The heat treatment apparatus according to claim 6, wherein the metal heating elements have three bent planes.

8. The heat treatment apparatus according to claim 6, wherein the heating chamber is formed of a SiC tube.

9. The heat treatment apparatus according to claim 1, wherein each plane of the two to four bent planes intersects each other and each plane extends between a top surface and a bottom surface of each metal heating element.

10. The heat treatment apparatus according to claim 1, wherein:

each metal heating element includes a top surface, a bottom surface and the single continuous side surface, and the two to four bent planes form the single continuous side surface and the two to four bent planes intersect each other and extend between the top surface and the bottom surface.

11. The heat treatment apparatus according to claim 10, wherein:

the side surfaces collectively form the approximately tubular polygonal shape in the first cross section in which each plane of the two to four bent planes faces a center of the approximately tubular polygonal shape.

* * * * *